United States Patent
Risaki

(10) Patent No.: US 8,390,061 B2
(45) Date of Patent: Mar. 5, 2013

(54) SEMICONDUCTOR DEVICE HAVING A TRENCH STRUCTURE AND METHOD FOR MANUFACTURING THE SAME

(75) Inventor: Tomomitsu Risaki, Chiba (JP)

(73) Assignee: Seiko Instruments Inc. (JP)

( * ) Notice: Subject to any disclaimer, the term of this patent is extended or adjusted under 35 U.S.C. 154(b) by 395 days.

(21) Appl. No.: 12/733,191

(22) PCT Filed: Aug. 20, 2008

(86) PCT No.: PCT/JP2008/064853
§ 371 (c)(1),
(2), (4) Date: May 6, 2010

(87) PCT Pub. No.: WO2009/028375
PCT Pub. Date: Mar. 5, 2009

(65) Prior Publication Data
US 2010/0289078 A1  Nov. 18, 2010

(30) Foreign Application Priority Data
Aug. 28, 2007  (JP) ................................. 2007-220964

(51) Int. Cl.
*H01L 29/66* (2006.01)
(52) U.S. Cl. .......................... 257/331; 257/332; 438/259
(58) Field of Classification Search .................. 438/386, 438/589, 243, 258, 259; 257/301, 302, 303, 257/330, 331, 332, 343
See application file for complete search history.

(56) References Cited

U.S. PATENT DOCUMENTS

| 5,468,663 A | * | 11/1995 | Bertin et al. | 438/259 |
| 5,656,544 A | * | 8/1997 | Bergendahl et al. | 438/386 |
| 5,932,911 A | | 8/1999 | Yue et al. | 257/330 |
| 2006/0001110 A1 | | 1/2006 | Igarashi | 257/401 |
| 2006/0223253 A1 | | 10/2006 | Risaki | 438/197 |

FOREIGN PATENT DOCUMENTS

| JP | 2006019518 | 1/2006 |
| JP | 2006294645 | 10/2006 |
| WO | 86 03341 | 5/1986 |

* cited by examiner

Primary Examiner — Ha Tran T Nguyen
Assistant Examiner — Thanh Y Tran
(74) Attorney, Agent, or Firm — Adams & Wilks

(57) ABSTRACT

A semiconductor device has a well region formed of a first conductivity type semiconductor at a predetermined depth from a surface of a substrate, trenches formed in the well region, and a gate insulating film formed on surfaces of concave and convex portions of the trenches. A first gate electrode is embedded inside the trenches, and a second gate electrode is formed on the substrate in contact with the first gate electrode in regions of the concave and convex portions excluding vicinities of both ends of the trenches. Source and drain regions of a second conductivity type are formed from a part of a surface of the semiconductor so as to extend deeper in a side surface of the concave portion of each trench than in the surface of the convex portion of each trench and shallower than the depth of the well region.

20 Claims, 4 Drawing Sheets

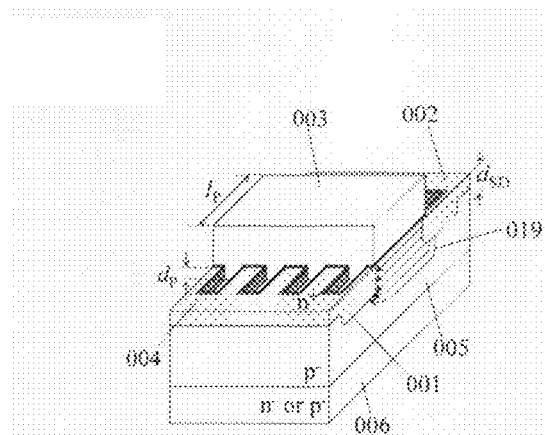
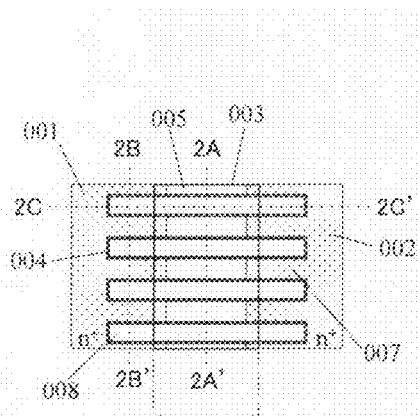
FIG. 1A  FIG. 1B
FIG. 1
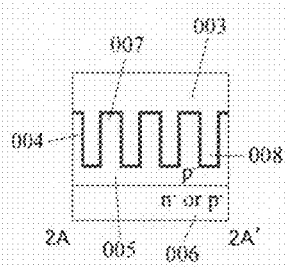
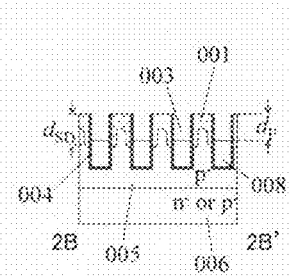
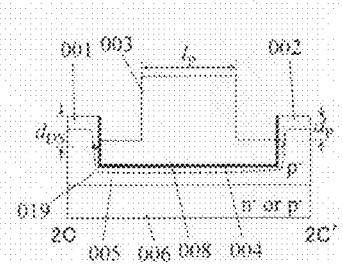
FIG. 2A  FIG. 2B  FIG. 2C
FIG. 2

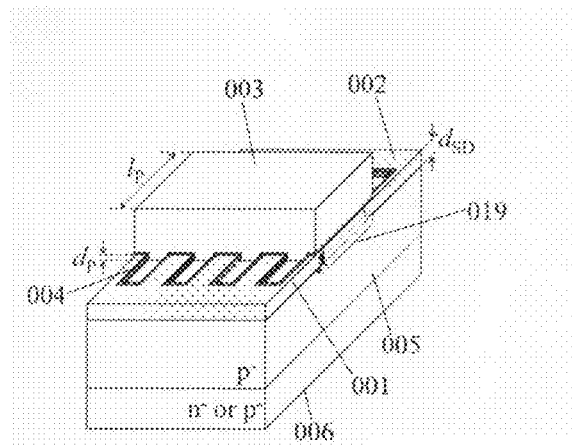
FIG. 3A
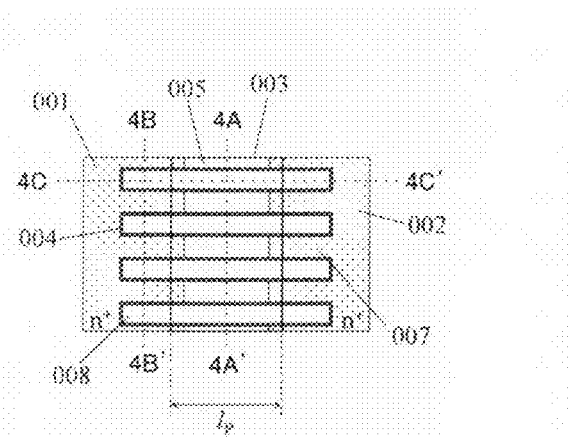
FIG. 3B
FIG. 3
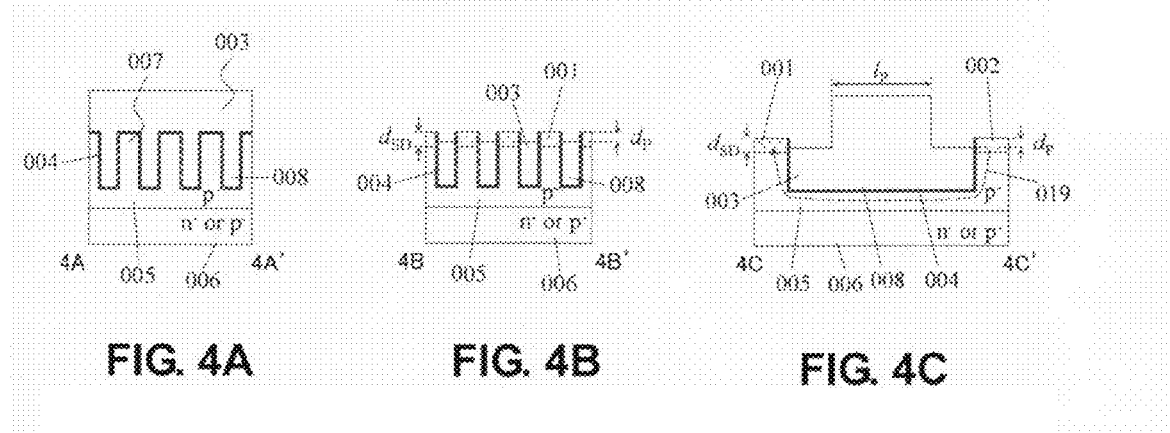
FIG. 4A  FIG. 4B  FIG. 4C
FIG. 4

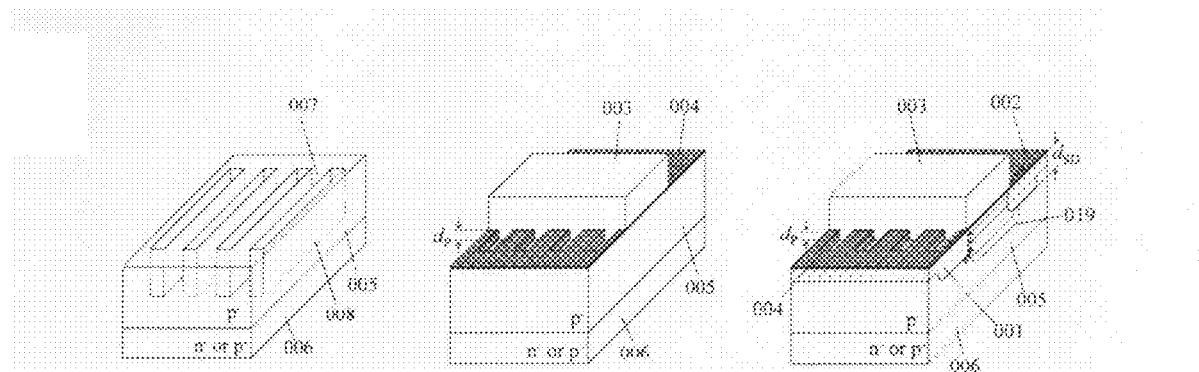
FIG. 5A FIG. 5B FIG. 5C
FIG. 5
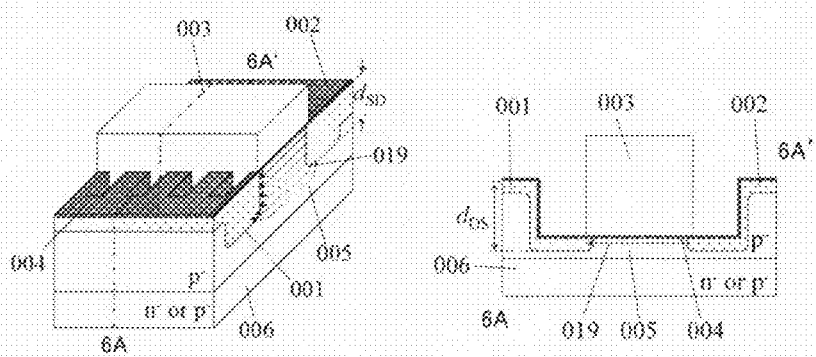
FIG. 6A FIG. 6B
FIG. 6

SEMICONDUCTOR DEVICE HAVING A TRENCH STRUCTURE AND METHOD FOR MANUFACTURING THE SAME

CROSS-REFERENCE TO RELATED APPLICATIONS

This application is a U.S. national stage application of International Application No. PCT/JP2008/064853 filed Aug. 20, 2008, claiming a priority date of Aug. 27, 2007, and published in a non-English language.

BACKGROUND OF THE INVENTION

1. Technical Field

The present invention relates to a semiconductor device having a trench structure.

2. Background Art

Along with the times, full use of fine processing technology has enabled manufacturing of smaller semiconductor devices without lowering performance. This trend also applies to a semiconductor element having high driving performance. The reduction of an ON resistance of the element per unit area has been achieved with the best use of fine processing technology. However, it is also a fact that lowering of withstanding voltage, which is caused by miniaturization of elements, hinders further improvement of the driving performance. Elements with various structures have been proposed in order to eliminate the trade-off between miniaturization and withstanding voltage. A trench gate metal oxide semiconductor (MOS) transistor is an example in a power MOS field effect transistor (FET) with a high withstanding voltage and a high driving performance, which is a current mainstream. The trench gate MOS transistor has the highest packing density in integration among double diffused MOS (DMOS) transistors having a high withstanding voltage and a high driving performance. The trench gate MOS transistor has, however, a longitudinal MOS structure in which current flows in a depth direction of a substrate. The transistor has extremely excellent performance as an element itself, but has a disadvantage when mounted on a chip with other ICs. When mounting on a chip with other ICs is taken into consideration, a conventional lateral MOS structure still has an advantage. A lateral trench gate transistor has been proposed as a method for further reducing ON resistance per unit area without lowering withstanding voltage. In this transistor, a gate portion has a trench structure having a convex portion and a concave portion to gain a larger gate width (for example, refer to Patent Document 1).

FIGS. 3 and 4 are conceptual views each illustrating a conventional lateral trench gate transistor, in which FIG. 3(a) is a bird's-eye view, FIG. 3(b) is a plan view, and FIGS. 4(a), 4(b), and 4(c) are cross-sectional views taken along the lines 4A-4A', 4B-4B', and 4C-4C' of FIG. 3(b), respectively. The lateral trench gate transistor includes: a plurality of trenches which are formed in parallel to a channel direction of a transistor, the transistor being formed in a p-type well region 005, the p-type well region 005 being formed in a surface of an n-type or p-type high resistance semiconductor substrate 006; concave portions 008 and convex portions 007 which are defined by the trenches, the convex portions 007 being located on both sides of the concave portions; a gate insulating film 004 which is formed on surfaces of the concave portions and the convex portions; a gate electrode 003 which fills the concave portions and is formed on the gate insulating film on the convex portions; and a source region 001 and a drain region 002 which are formed on a surface of the well region on both sides of the gate electrode so as to be interlocked with the trenches. It should be noted in FIG. 3(b) that, for simplicity of the figure, the gate electrode 003 and the gate insulating film 004 are transparent outside of the trenches, and edges of the gate electrode 003 are indicated by thick lines. According to the invention of Patent Document 1, a gate portion has the trench structure, to thereby increase a gate width of a lateral MOS per unit plane area and reduce an ON resistance. Broken lines 019 of FIGS. 3(a) and 4(c) indicate a path of a current flowing through the transistor.

Patent Document 1: JP 2006-294645 A

However, the invention of Patent Document 1 has one problem. In the invention of Patent Document 1, a channel length near a bottom part of the entire trench becomes longer than a channel length near an upper part of the entire trench as the trench becomes deeper and a length $L_P$ of an upper part of the gate electrode illustrated in FIGS. 3 and 4 becomes shorter. As a result, there arises a problem that not enough current flows along the current path 019 near the bottom part of the trench as illustrated in FIGS. 3 and 4 and thus a sufficient driving performance may not be obtained.

SUMMARY OF THE INVENTION (1) Therefore, the present invention provides a semiconductor device and a method of manufacturing the same, the semiconductor device including: a well region which is formed of a high resistance first conductivity type semiconductor at a predetermined depth from a surface of a semiconductor substrate; a plurality of trenches which extend from a surface to a midway depth of the well region; a gate insulating film which is formed on surfaces of concave and convex portions formed by the trenches; a gate electrode which is embedded inside the trenches; a gate electrode film which is formed on the surface of the substrate in contact with the gate electrode embedded inside the trenches in regions of the concave and convex portions, the regions excluding vicinities of both ends of the trenches; another gate electrode film which is embedded inside the trenches in the vicinities of the both ends of the trenches in contact with the gate electrode film so that a surface of the another gate electrode film is located at a position deeper than the surface of the semiconductor substrate; and a source region and a drain region which are formed as two low resistance second conductivity type semiconductor layers from a part of a surface of the first conductivity type semiconductor that is out of contact with the another film so that the source and drain regions are formed film, so as to be shallower than the depth of the well region.

(2) In the semiconductor device according to item (1), in a structure in which the semiconductor surface in each of the source region and the drain region is lower than a height of the convex portion of a trench region excluding the vicinities of the both ends of the trenches, the semiconductor device includes the source region and the drain region which are formed as two low resistance second conductivity type semiconductor layers from a part of the semiconductor surface, the part being out of contact with the another gate electrode film, so as to be shallower than the depth of the well region.

(3) In the semiconductor device according to item (1) or (2), in a structure in which the gate electrode film does not exist inside the trenches in the vicinities of the both ends of the trenches, the semiconductor device includes the source region and the drain region which are formed as two low resistance second conductivity type semiconductor layers from a part of the semiconductor surface, the part being out of contact with the another gate electrode film, so as to be shallower than the depth of the well region.

The depths of the source region and the drain region are made deeper, to thereby allow enough current to flow through a channel near the bottom part of the trench. Accordingly, the driving performance is enhanced.

BRIEF DESCRIPTION OF THE DRAWINGS

FIGS. 1(a)-1(b) are views each illustrating a basic structure according to the present invention. FIG. 1(a) is a bird's-eye view, and FIG. 1(b) is a plan view.

FIGS. 2(a)-2(c) are cross-sectional views of FIG. 1(b). FIGS. 2(a), 2(b), and 2(c) are taken along the lines 2A-2A', 2B-2B', and 2C-2C', respectively.

FIGS. 3(a)-3(b) are views each illustrating an embodiment according to the prior art. FIG. 3(a) is a bird's-eye view, and FIG. 3(b) is a plan view.

FIGS. 4(a)-4(c) are cross-sectional views of FIG. 3(b). FIGS. 4(a), 4(b), and 4(c) are taken along the lines 4A-4A', 4B-4B', and 4C-4C', respectively.

FIGS. 5(a)-5(c) are bird's-eye views each illustrating a manufacturing process according to the present invention.

FIGS. 6(a)-6(b) are views each illustrating the basic structure and a manufacturing process thereof according to the present invention. FIG. 6(a) is a bird's-eye view, and FIG. 6(b) is a cross-sectional view taken along the line 6A-6B'.

FIG. 7(a) is a bird's-eye view, and FIG. 7(b) is a cross-sectional view taken along the line 7A-7A'.

Figure 7:
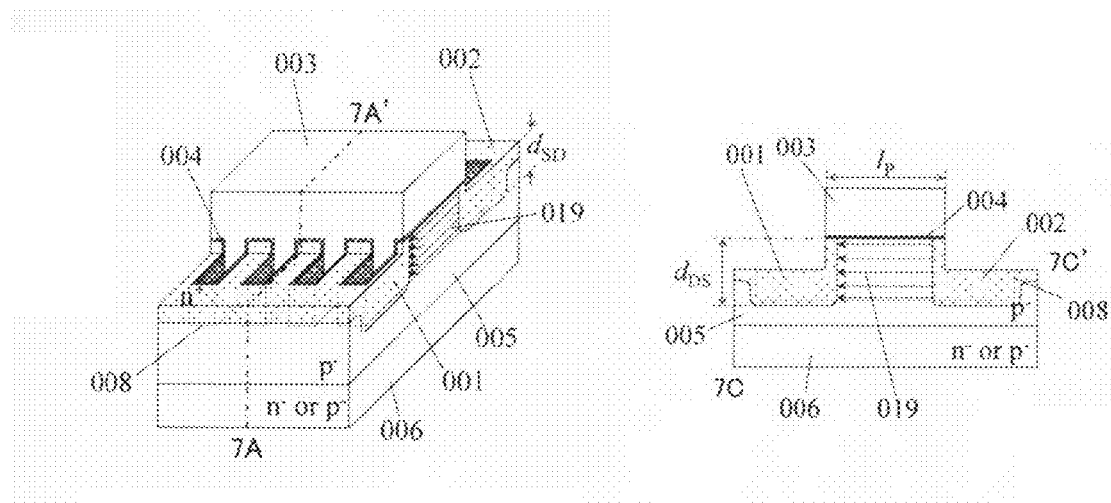
FIGS. 7(a)-7(b) are views each illustrating the basic structure and the manufacturing process thereof according to the present invention.

DESCRIPTION OF SYMBOLS 001 source region
002 drain region
003 gate electrode
004 gate insulating film
005 well region
006 high resistance semiconductor substrate
007 convex portion
008 concave portion
019 current path Detailed Description of the Invention A first embodiment of the present invention is described with reference to FIGS. 1 and 2.

FIG. 1(a) is a bird's-eye view, FIG. 1(b) is a plan view, and FIGS. 2(a), 2(b), and 2(c) are cross-sectional views taken along the lines 2A-2A', 2B-2B', and 2C-2C' of FIG. 1(b), respectively. In FIGS. 1 and 2, components corresponding to those of the prior art illustrated in FIGS. 3 and 4 are denoted by the same reference symbols. It should be noted in FIG. 1(b) that, for simplicity of the figure, a gate electrode 003 and a gate insulating film 004 are transparent outside of trenches, and edges of the gate electrode 003 are indicated by thick lines. The first embodiment is different from the prior art in that a distance $d_P$ from a surface of a semiconductor substrate to a surface of the gate electrode embedded inside the trench is made larger in order to form a source region 001 and a drain region 002 as deep as possible below a concave portion of the trench. As illustrated in FIGS. 2(b) and 2(c), in a structure having a large distance $d_P$, when the source/drain regions are formed by a multi-direction oblique ion implantation method, the ions enter side wall portions of the trench having the distance $d_P$. As a result, the source/drain regions may be formed to a deeper part than in the prior art, and depths of the source/drain regions may be made up to as deep as $d_{SD}$ that is substantially the same depth as the distance $d_P$. Accordingly, as illustrated in FIG. 1(a), a larger current is allowed to flow along a current path 019 in a bottom part region of the trench compared with the prior art, and hence a driving performance is enhanced.

FIGS. 5(a)-5(c) each illustrate a method of manufacturing a lateral trench gate transistor having the above-mentioned structure. First, as illustrated in FIG. 5(a), a p-type well 005 is formed in an n-type or p-type semiconductor substrate 006, and then a trench having a convex portion 007 and a concave portion 008 is formed (normally, a plurality of trenches are formed). Next, as illustrated in FIG. 5(b), an oxide film having a predetermined film thickness is grown by thermal oxidation to form the gate insulating film 004. Subsequently, for example, Poly-Si is deposited for the formation of the gate electrode 003. After that, a predetermined part of the Poly-Si is masked by a resist, and the other part of the Poly-Si is etched. In the etching, the Poly-Si is etched to such an extent that the oxide film in the source/drain regions does not disappear due to etching loss while the Poly-Si embedded inside the trench is removed as much as possible, to thereby increase the distance $d_P$. More specifically, the gate electrode includes: a second gate electrode formed on the surface of the semiconductor substrate; a first gate electrode that is located below the second gate electrode and embedded inside the trench; and a third gate electrode that is formed on both sides of the first gate electrode inside the trench and has a surface to be etched. After that, as illustrated in FIG. 5(c), n-type ionic species are implanted, and the source/drain regions (001 and 002) are formed by self-alignment. In this case, by implanting ions using the multi-direction oblique ion implantation method, the ions are implanted into side walls of the trench on which the gate electrode is not formed. As a result, the source/drain regions may be formed to a deeper part than in the prior art.

When the depths of the source/drain regions are made equal to a height of the bottom part of the trench, the driving performance is most enhanced. As illustrated in FIGS. 6(a) and 6(b), this may be realized by completely removing a part of the gate electrode inside the trench, the part being not masked in the above-mentioned etching of the gate electrode. However, there may be a case where, depending on a depth of the trench, a thickness of the gate oxide film, and an etching selectivity of the gate electrode to the oxide film, the oxide film in the source/drain regions disappear due to etching loss before the gate electrode inside the trench is completely removed, the etching reaches the silicon in the source/drain regions, and a shape as illustrated in FIGS. 7(a) and 7(b) is obtained. However, even with this shape, by implanting n-type ionic species using the multi-direction oblique ion implantation method similarly to the above, the source/drain regions may be formed to a still deeper part. As a result, the formed transistor functions as a high driving performance MOS.

In the above-mentioned embodiment, it is needless to say that a p-channel MOS structure may also be made in the same manner by reversing conductivity types. The use of a twin well technology easily enables making a CMOS structure having a high driving performance in one chip and also integrally mounting an IC. The above description is given on the basic structure and the basic manufacturing method according to the present invention.

Now, a description will be given to the application of the basic structure.

In ordinary planar MOS transistors, various structures exist aiming to improve the withstanding voltage based on a basic structure. In the present invention, an improvement of withstanding voltage may be attained easily by combining conventional art of the LDD (light doped drain) structure, the DDD (double diffused drain) structure, the LDMOS (lateral double diffused MOS) structure, or the like to the basic structure (FIGS. 5 to 7).

Also, the width of the convex portion 007 illustrated in FIG. 1 is about 1,000 Å whereby the inner part of the convex portion is fully depleted when the MOS transistor is in the ON state, and the sub-threshold characteristic is improved. Accordingly, leak current between the source and the drain is reduced, the threshold may be lowered, and the driving performance may be resultantly further improved.

Further, when the present invention and the conventional twin well technology are adopted in combination, it becomes possible to integrally mount a semiconductor device with a bipolar channel according to the present invention and a normal IC on the same chip, which enables easily making an IC with which a CMOS driver is integrally mounted.

The embodiment of the present invention has been described, but the present invention is not limited to the above embodiment and may be modified within a range that does not depart from the gist of the invention.

The invention claimed is:

1. A semiconductor device, comprising:
   a which is which is formed of a high resistance first conductivity type semiconductor at a predetermined depth from a surface of a semiconductor substrate;
   a plurality of trenches extending from a surface to a midway depth of the well region;
   a gate insulating film formed on surfaces of a concave portion and a convex portion formed by each of the trenches;
   a first gate electrode embedded inside the trenches;
   a second gate electrode formed on the surface of the semiconductor substrate in contact with the first gate electrode in regions of the concave portion and the convex portion, the regions excluding vicinities of both ends of the trenches;
   a third gate electrode embedded inside the trenches in the vicinities of the both ends of the trenches in contact with the first gate electrode and the second gate electrode so that a surface of the third gate electrode is located at a position deeper than the surface of the semiconductor substrate; and
   a source region and a drain region formed as low resistance second conductivity type semiconductor layers from a part of a surface of the high resistance first conductivity type semiconductor that is out of contact with the third electrode so that the source and drain regions are formed electrode, so as to be deeper in a side surface of the concave portion of each of the trenches than in the surface of the convex portion of each of the trenches and shallower than the depth of the well region.

2. A semiconductor device according to claim 1, wherein the third gate electrode is omitted.

3. A semiconductor device according to claim 2, wherein each of the source region and the drain region has an upper surface located at a position lower than an uppermost surface of the gate insulating film.

4. A semiconductor device according to claim 2, wherein each of the source region and the drain region has a light doped drain (LDD) structure.

5. A semiconductor device according to claim 2, wherein the each of the source region and the drain region has a double diffused drain (DDD) structure.

6. A semiconductor device according to claim 2, wherein each of the source region and the drain region has a lateral double diffused metal oxide semiconductor (LDMOS) structure.

7. A semiconductor device according to claim 2, wherein a width of the convex portion of each trench is approximately 1,000 Å.

8. A semiconductor device according to claim 2, wherein the well region is formed using a twin well technique.

9. A semiconductor device according to claim 2, wherein the semiconductor substrate has the first conductivity type.

10. A semiconductor device according to claim 2, wherein the semiconductor substrate has the second conductivity type.

11. A semiconductor device according to claim 1, wherein each of the source region and the drain region has a light doped drain (LDD) structure.

12. A semiconductor device according to claim 1, wherein the each of the source region and the drain region has a double diffused drain (DDD) structure.

13. A semiconductor device according to claim 1, wherein each of the source region and the drain region has a lateral double diffused metal oxide semiconductor (LDMOS) structure.

14. A semiconductor device according to claim 1, wherein a width of the convex portion of each trench is approximately 1,000 Å.

15. A semiconductor device according to claim 1, wherein the well region is formed using a twin well technique.

16. A semiconductor device according to claim 1, wherein the semiconductor substrate has the first conductivity type.

17. A semiconductor device according to claim 1, wherein the semiconductor substrate has the second conductivity type.

18. A semiconductor device according to claim 1, wherein a width of the convex portion of each trench is approximately 1,000 Å.

19. A method of manufacturing a semiconductor device, comprising:
   forming a well region of a high resistance first conductivity type semiconductor at a predetermined depth from a surface of a semiconductor substrate;
   forming a plurality of trenches which extend from a surface to a midway depth of the well region;
   forming a gate insulating film on surfaces of a concave portion and a convex portion formed by each of the trenches;
   depositing a gate electrode material inside the trenches and on the surface of the semiconductor substrate;
   etching the gate electrode material to form:
      a first gate electrode which is embedded inside the trenches;
      a second gate electrode which is formed on the surface of the semiconductor substrate in contact with the first gate electrode in regions of the concave portion and the convex portion, the regions excluding vicinities of both ends of the trenches; and
      a third gate electrode which is embedded inside the trenches in the vicinities of the both ends of the trenches in contact with the first gate electrode and the second gate electrode so that a surface of the third gate electrode is located at a position deeper than the surface of the semiconductor substrate; and forming, by a multi-direction oblique ion implantation method, a source region and a drain region as low resistance second conductivity type semiconductor layers from a part of a surface of the high resistance first conductivity type semiconductor that is out of contact with the third gate electrode so that the source and drain regions are deeper in a side surface of the concave portion of each of the trenches than in the surface of the convex portion of each of the trenches and shallower than the depth of the well region.

20. A method of manufacturing a semiconductor device according to claim 19, further comprising etching the surface of the high resistance first conductivity type semiconductor in the source region and the drain region at the same time as the etching of the gate electrode material.

* * * * *